United States Patent [19]

Vesterling

[11] 3,714,514

[45] Jan. 30, 1973

[54] CIRCUIT BOARD ARRANGEMENT INCLUDING SOCKET MEMBERS MOUNTED ON THE CIRCUIT BOARD FOR HOLDING CAPACITORS HAVING ROUNDED BOTTOMS

[75] Inventor: Karin Vesterling, Stuttgart, Germany

[73] Assignee: Robert Bosch GmbH, Stuttgart, Germany

[22] Filed: Dec. 30, 1971

[21] Appl. No.: 214,310

[30] Foreign Application Priority Data

Jan. 23, 1971 Germany....................P 21 03 158.3

[52] U.S. Cl.............317/101 C, 174/138 G, 248/314

[51] Int. Cl...............................................H05k 1/18

[58] Field of Search...174/50, 52 R, 138 G; 248/314; 317/101 R, 101 C, 101 CC; 339/17 C

[56] References Cited

UNITED STATES PATENTS

| | | | |
|---|---|---|---|
| 2,483,351 | 9/1949 | Richardson | 174/138 G UX |
| 2,979,554 | 4/1961 | Maitland | 174/138 G |
| 3,184,536 | 5/1965 | Vincent | 174/138 G |
| 3,197,164 | 7/1965 | Hansen | 174/138 G UX |
| 3,241,094 | 3/1966 | Harton | 174/138 G UX |
| 3,324,226 | 6/1967 | Tems et al. | 174/138 G X |
| 3,524,156 | 8/1970 | Horbach | 317/101 CC X |

FOREIGN PATENTS OR APPLICATIONS

| | | | |
|---|---|---|---|
| 1,213,316 | 10/1959 | France | 174/138 G |
| 930,613 | 7/1963 | Great Britain | 317/101 C |

*Primary Examiner*—Laramie E. Askin
*Attorney*—Michael S. Striker

[57] ABSTRACT

A device for mounting electrical components having spherical or tear-shaped portions and having leads, particularly tantalum electrolytic capacitors, on one side of a circuit board having a mounting surface and having a plurality of holes arranged in a predetermined manner, consists of a plastic socket having the shape of a rectangular prism. The socket has a nesting portion formed by four elements projecting from the base, one element projecting from a respective corner of the rectangular base. The four elements, in combination, form the nesting portion which is adapted to receive the spherical or tear-shaped portion in abutting relationship in its mounted position. The socket has a base which has a surface corresponding to and which abuts against the mounting surface of the circuit board in the mounted position of the socket. The socket is provided with openings spaced from each other to correspond to the spacing of the holes in the circuit board for passing the leads through the circuit board holes to permit the leads to be connected to the circuit board after the component has been mounted on the socket and the latter on the circuit board.

4 Claims, 3 Drawing Figures

CIRCUIT BOARD ARRANGEMENT INCLUDING SOCKET MEMBERS MOUNTED ON THE CIRCUIT BOARD FOR HOLDING CAPACITORS HAVING ROUNDED BOTTOMS

BACKGROUND OF THE INVENTION

The present invention relates to a device for mounting electrical components, and particularly for mounting electrical components on circuit boards which have spherical or tear-shaped portions, such as tantalum electrolytic capacitors.

Components are frequently mounted on electrical circuit board for connecting the components together and arranging them in circuits. For this purpose, most components designed to be mounted in this way are provided with leads which are designed to facilitate such mounting. Accordingly, these components are usually provided with a plurality of leads which all face in the direction of the circuit board so that the leads can be passed through appropriate holes provided in the circuit board. The components mounted are usually all placed on one side of the circuit board, the other side usually being used to connect the leads to selected circuit points.

For components having regular shapes, circuit board mounting has not presented any substantial problems. Thus, components which are provided with surfaces which abut the mounting surfaces of the circuit board in the mounted condition are stable against vibrations or other undesired movements. In effect, these components are provided with an inherently flat base which abuts against the mounting surface which renders the component immune, to a great extent, to undesired movements once the component has been mounted.

Many components, however, are not shaped in such a way that they have a flat base portion which mates with the mounting surface of the circuit board in the region of the leads of the electrical component. For example, many small capacitors, and particularly tantalum electrolytic capacitors, have spherical or tear-shaped portions in the region of the leads, these portions resting on the mounting surface of the circuit board after mounting. After mounting, these electrical components are not in stable positions in respect to the circuit board but they usually can and do move in response to movements of the circuit board or to vibrations thereof. Since these components are held to the circuit board by means of the component leads passing through the holes in the board, to make connections at the other side thereof, this creates the danger that continued movement of the components, and the corresponding flexing of the leads, may result in the leads weakening and ultimately breaking.

Although mounting sockets are already known, these generally are for components which have regular shapes and which, in fact, do not need mounting sockets for movement prevention. The known mounting sockets are often used as spacers and to electrically insulate a component from another electrical component or a circuit potential point.

SUMMARY OF THE INVENTION

It is an object of the present invention to provide a device for mounting electrical components having spherical or tear-shaped portions which do not have the disadvantages of the prior art.

It is another object of the present invention to provide a device for mounting electrical components having spherical or tear-shaped portions which is simple in construction and inexpensive to manufacture and which can effectively prevent electrical components having such portions from movements in response to movements of the circuit board on which they are mounted.

It is another object of the present invention to provide a device for mounting electrical components having spherical or tear-shaped portions which are simple in construction and inexpensive to manufacture and which are easily adaptable for use with printed circuit boards.

According to the present invention a device for mounting electrical components having spherical or tear-shaped portions and having leads, particularly tantalum electrolytic capacitors, on one side of a circuit board having a mounting surface and having a plurality of holes arranged in a predetermined manner, is provided which consists of a socket having a nesting portion adapted to receive said spherical or tear-shaped portion in abutting relationship. The socket has a base portion having a surface corresponding to and abutting against said mounting surface of said circuit board in the mounted position of said socket. The socket has openings spaced to correspond to the spacing of the holes in the circuit board for passing the leads through the holes in the circuit board. In this manner, the leads can be connected to the circuit board after said component has been mounted on the socket and the latter on the circuit board.

According to a presently preferred embodiment, the socket has the form of a rectangular prism. The base portion is of rectangular shape and the nesting portion is formed by four elements projecting from the base portion, each of the elements projecting from another respective corner of the rectangular base portion.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
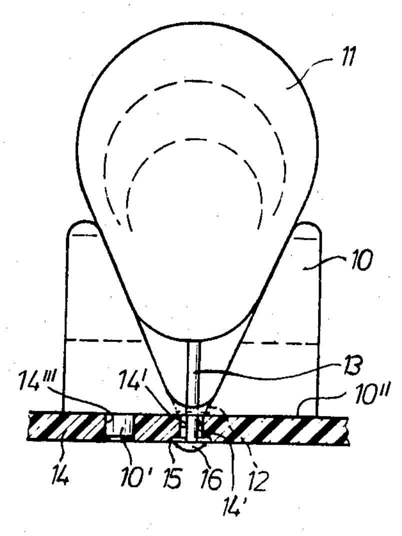
FIG. 1 is a front side elevational view of a mounting socket in accordance with the present invention, showing how the socket is used to mount a tear-shaped electrical component on a circuit board.

Referring to the drawings, in which like reference numerals are used to denote like parts, throughout, and looking first at FIG. 1, a mounting socket 10 generally has the shape of a rectangular prism. The mounting socket 10 has a base portion which has a substantially flat abutting surface 10'' which corresponds to and abuts against the mounting surface 14'' of the circuit board 14. An electrical component 11 having a spherical or tear-shaped portion, here a tantalum electrolytic capacitor, is provided with two leads 13 which both project from the capacitor 11 in the same direction for passing through the circuit board 14 for mounting thereon. The dashed lines on the capacitor 11 are merely illustrative to show that capacitors having this general shape but having different sizes can nevertheless be accommodated by the mounting socket 10.

The mounting socket 10 has, as above described, a rectangular base portion or surface 10''. Elements project from the base portion, each of the elements projecting from another respective corner of the rectangular base portion to define a nesting portion adapted to receive the spherical or tear-shaped portion of the electrical component in abutting relationship therewith in the mounted position of the electrical component to prevent its movement.

Figure 2:
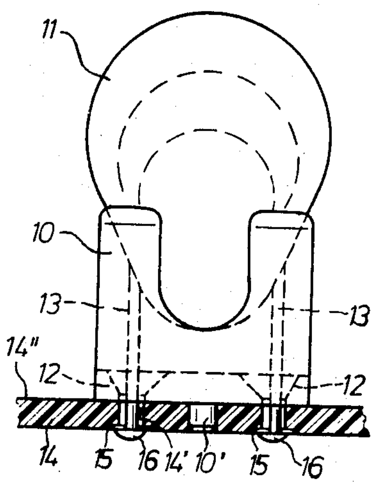
FIG. 2 is a side elevational view of the mounting socket as shown in FIG. 1.

Referring both to FIGS. 1 and 2, the mounting socket 10, in the region of the base portion, is provided with a suitable number of openings 12 for the passage of the leads 13 of the capacitor for connection to the circuit board 14. As shown in FIG. 2, the openings 12 can be funnel shaped to facilitate the insertion of the leads 13 into the openings 12.

The mounting socket 10 is provided with a short projection 10' which fits into a corresponding socket locating hole 14''' in the circuit board 14.

The mounting operation only requires that the projection 10' be first mated with the corresponding socket locating hole 14'''. This, in a properly laid out circuit board not only prevents the socket 10 from undesired movement along the circuit board 14, but the mounting socket 10 also aligns the openings 12 with corresponding holes 14' in the circuit board 14 so that the leads 13 can easily be passed therethrough.

Once the mounting socket 10 has been appropriately located, the electrical component or the capacitor 11 is then lowered into the socket, with the leads 13 being inserted into the openings 12. Once the leads 13 can freely move through the openings 12 and holes 14', the capacitor 11 is lowered until it comes into contact with the four spaced elements which form the nesting portion of the mounting socket 10. When the capacitor 11 has reached the position shown in FIGS. 1 and 2, the leads 13 can then be cut to suitable length and soldered as at 15 to appropriate copper connecting points 16 in a commonly known manner.

The particular shape of the mounting socket 10, illustrated in FIGS. 1 and 2, is only illustrative and the invention is not limited to that one configuration. The invention in its broader aspects contemplates a mounting socket having any configuration which has a base portion with an abutting surface 10'' which corresponds to and abuts against a mounting surface 14'' of a circuit board. It is the provision of the abutting surface 10'' which results in the stable positioning of the electrical components which are nested within the holding elements. Once an abutting surface, such as 10'', is provided, the mounting socket must also provide a nesting portion which can accommodate electrical components which have surfaces other than flat surfaces that are perpendicular to the direction of the leads. Thus, such sockets must include nesting portions to accommodate spherical, tear-shaped or other irregularly shaped portions. Finally, the mounting socket 10 must include openings 12 for the passage of the leads of the electrical components through the mounting socket and to the circuit board for mounting or connecting thereto.

Figure 3:
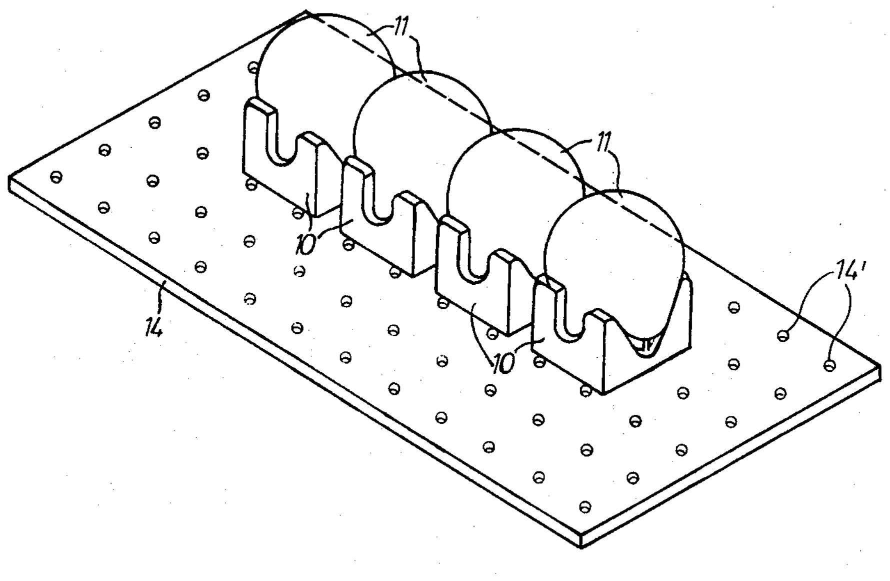
FIG. 3 is a perspective view of a plurality of mounting sockets, each of the type as shown in FIG. 1, mounted adjacent to one another on a printed circuit board.

FIG. 3 shows a plurality of mounting sockets 10 mounted on the circuit board 14. It will be noted that the circuit board is provided with a plurality of holes 14' which are arranged in a predetermined manner. Such circuit boards are commonly available and used in the construction of electrical circuits. Accordingly, the mounting sockets 10 can be made of different sizes to accommodate different sized electrical components or to enable the mounting of electrical components on circuit boards having different hole spacings. Also, the mounting sockets 10 can be so dimensioned that they are mountable adjacent to one another in a straight line as shown in FIG. 3.

The mounting sockets 10 can be made out of any suitable material commonly used for such purposes. Materials commonly used for mounting sockets in electrical circuits include plastics and Teflon.

Referring again to FIG. 1, it will be appreciated that movement or vibrations of the circuit board 14 will not cause movements of the capacitor 11 relative to the leads 13. This is important because such movement would result in flexing of the leads 13, which after a number of such flexing incidents, may result in the weakening and breaking of the leads 13. Here, the movements of the circuit board 14 are transmitted simultaneously to the body of the capacitor 11 via the mounting socket 10 so that the body of the capacitor 11 does not have occasion to move relative to the leads 13 which are rigidly attached, at one end, to the circuit board 14. In order to further assure that the capacitor 11 is rigidly affixed to the mounting socket 10 some hardenable epoxy can be placed between the capacitor 11 and the socket 10. When a hardenable epoxy, such as casting resin, hardens, it effectively produces a solid mass consisting of the body of the capacitor 11 and the mounting socket 10.

It will be understood that each of the elements described above, or two or more together, may also find a useful application in other types of mounting devices differing from the types described above.

While the invention has been illustrated and described as embodied in a device for mounting electrical components having spherical or tear-shaped portions, particularly tantalum electrolytic capacitors, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

1. A circuit board arrangement comprising, in combination, a circuit board provided with a plurality of spaced holes; at least one generally prismatic socket member of plastic material mounted on said board and having at the one end of said member nearest said board a projection received in one of said holes for securing said member on said board, and said member having a portion defining a receptacle for nesting a bulbous body, said receptacle having an open end at the end of said member opposite said one end of said member, said socket member having two generally tunnel-shaped bores passing from the interior of said receptacle through said one end of said socket member and each converging in direction towards said board, and each of said funnel-shaped bores being aligned with one of said holes of said board; and a bulbous capacitor supported by said socket member and having a rounded bottom nested in said receptacle, said capacitor being engaged and supported by said socket member only at said rounded bottom of said capacitor, and said capacitor having two connecting wires each passing through one of said funnel-shaped bores and through the corresponding one of aligned holes of said circuit board.

2. An arrangement as defined in claim 1, wherein said socket member is of generally rectilinear form and has a generally rectangular base portion at said one end thereof and adjacent to said circuit board, and wherein said socket member has four portions projecting from said base portion in direction substantially normally away from said circuit board, and wherein said rounded bottom of said capacitor is engaged only by said four portions of said socket member.

3. An arrangement as defined in claim 2, wherein said rounded bottom of said capacitor is connected to said four projecting portions of said socket member by means of hardened resin material.

4. An arrangement as defined in claim 1; and further including a plurality of additional socket members identical to the aforementioned socket member, and wherein said socket members are all identically mounted on said circuit board and aligned in a straight row.

* * * * *